United States Patent [19]

Wong

[11] Patent Number: 4,686,452

[45] Date of Patent: Aug. 11, 1987

[54] REFERENCE-VOLTAGE SOURCE FOR REPLICATING A TERMINAL VOLTAGE OF A SATURATED TRANSISTOR

[75] Inventor: Thomas S. Wong, San Jose, Calif.

[73] Assignee: Advanced Micro Devices, Inc., Sunnyvale, Calif.

[21] Appl. No.: 847,412

[22] Filed: Apr. 3, 1986

[51] Int. Cl.[4] ............................................. G05F 3/20
[52] U.S. Cl. .................................... 323/314; 307/305
[58] Field of Search ............... 323/313, 314, 315, 316; 307/296 R, 297, 305

[56] References Cited

U.S. PATENT DOCUMENTS 4,260,945  4/1981  Ahmed ............................. 323/316

FOREIGN PATENT DOCUMENTS 1227988 11/1966 Fed. Rep. of Germany ...... 323/315
164606 10/1982 Japan ................................. 323/315

Primary Examiner—Peter S. Wong
Assistant Examiner—Judson H. Jones
Attorney, Agent, or Firm—Patrick T. King; Davis Chin

[57] ABSTRACT

The circuit derives Vbep, the base-emitter voltage of a saturated PNP transistor, from the PNP portion of a four-layer (PNPN) silicon-controlled rectifier (SCR) so as to exactly match the characteristics of the PNP portion of an SCR against which the reference voltage is to be compared. The operating point of the SCR in the voltage-reference circuit is adjusted and controlled to duplicate the operating conditions in the circuit to be measured. The voltage between the end layers of the SCR includes the sum of Vbep and Vcen, the collector-emitter drop of the NPN portion of the SCR. The circuit processes this voltage to remove the Vcen term, providing an output voltage which depends upon Vbep.

18 Claims, 2 Drawing Figures

REFERENCE-VOLTAGE SOURCE FOR REPLICATING A TERMINAL VOLTAGE OF A SATURATED TRANSISTOR

BACKGROUND OF THE INVENTION

The present invention relates generally to improvements in reference-voltage sources, more particularly to voltage-reference circuits for emulating the voltage at certain points in an integrated circuit, and especially to a circuit which accurately replicates the base-emitter voltage of a saturated PNP transistor. Such a circuit has several significant applications in the field of memory devices and other integrated circuits.

The dominant process technology in bipolar semiconductor devices today is the NPN process, which results in vertical formation of NPN transistors and lateral formation of PNP transistors on a substrate. For reasons which do not concern the present invention, a consequence of the use of this process technology is that the replication of NPN terminal voltages for use in a reference-voltage source is easy, while the replication of PNP terminal voltages is much more difficult.

One particularly important application for a reference-voltage source arises in the use of a differential sense amplifier to read the data stored in a memory cell. In order to optimize the speed of reading such data, the sense amplifier needs to be able to respond to very small difference voltages, and for this purpose it needs a reference voltage which is accurately tailored to the voltage levels to be sensed. When the memory cell utilizes only NPN transistors, the task of deriving a suitable voltage reference is relatively straightforward.

However, when the memory device is of the sort which uses silicon-controlled rectifiers (SCRs) as the active devices of its core cells as is sometimes the case, the problem of providing an accurate reference voltage for sense operations is more difficult. As will become apparent in the later detailed description of this invention, the use of the SCR device causes a PNP transistor to be included in each branch of the core cell. Consequently, the reference voltage source needs to be able to successfully replicate the voltage between the base and emitter of this transistor when it is in a saturated condition.

As will also be discussed in more detail later, one method of sensing the data stored in a memory cell involves establishing a sense-level voltage which is intermediate between the voltage levels used to represent logic 1 and 0. In an important application of this method to the sensing of a type of memory cell using SCRs as core-cell elements, the logic 1 and 0 voltage levels differ from one another by the base-emitter drop of a saturated PNP transistor in the core cell. Accordingly, the generation of a suitable sense-level voltage requires that the reference-voltage source successfully replicate the base-emitter voltage of this saturated PNP transistor.

Although myriad designs of voltage-reference sources have been proposed for various purposes, they are generally unsuitable in the critical applications for which the present invention is intended for a variety of reasons. In general, they lack the ability to accurately duplicate, under all operational conditions, the voltage level from which deviations must be sensed. This failure is in many cases due to reliance upon reference-voltage-establishing circuit elements which do not have exactly the same voltage-current characteristics as are present in the memory cell or other source of measured voltage.

DESCRIPTION OF THE RELATED ART

U.S. Pat. No. 4,272,811, issued June 9, 1981 to Thomas S. Wong, illustrates and describes a write and read control circuit for semiconductor RAMs. This circuit is generally representative of the area of application of the present invention, although it uses no PNP transistors and therefore does not face the problem of deriving a reference voltage which is a function of the base-emitter voltage of a saturated PNP transistor.

SUMMARY OF THE INVENTION

An object of the present invention is to provide a reference-voltage source having superior ability to match a given level of measured voltage.

A second object of the present invention is to provide a reference-voltage source having superior ability to match a terminal-voltage level of a saturated transistor.

A third object of the present invention is to provide a reference-voltage source whose output voltage is directly related to the base-to-emitter voltage of a saturated transistor.

A fourth object of the present invention is to provide a reference-voltage source having a stable output voltage which substantially duplicates the base-to-emitter voltage of a saturated PNP transistor.

To the above ends, a reference-voltage source according to the present invention includes a voltage-determining cell of exactly the same type and characteristics as the device whose voltage is to be monitored. In particular, the voltage-determining cell includes an SCR when the memory cell whose logic level is to be sensed also uses SCRs as its core-cell elements. By using identical devices to generate the reference voltage and store data in the memory cell, it is possible to cause the reference and measured voltages to track one another to a very high order of accuracy.

The reference source according to the present invention also includes means to adjust the current in the voltage-determining cell such that the voltages within this cell match those of the similar memory core-cell, and means to shift the dc level of the output voltage.

The above and other features, objects and advantages of the present invention together with the best mode known to the inventor thereof for carrying out his invention will become more apparent from reading the following description of a preferred embodiment of the invention and from studying the associated drawing, in which:

DETAILED DESCRIPTION OF THE PRESENT INVENTION

Figure 1:
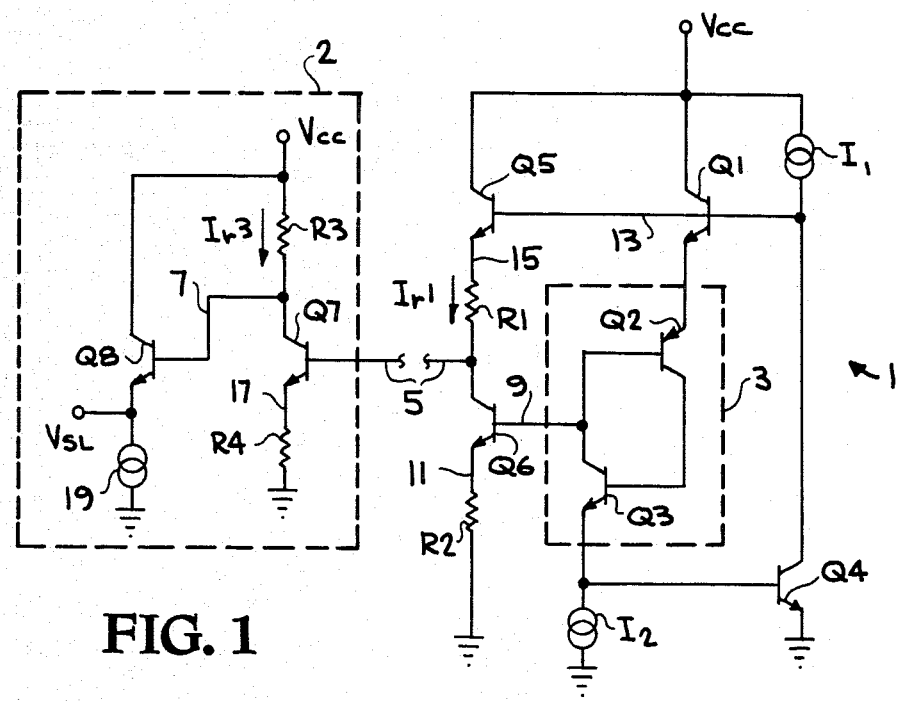
FIG. 1 in an illustration in schematic form of a reference-voltage source according to the present invention.

In FIG. 1, a voltage-reference circuit 1 according to the present invention is shown. Circuit 1 as illustrated has been designed to produce an output voltage which is equivalent to the base-emitter voltage of a saturated PNP transistor, which will be symbolized as $V_{bep}$ throughout the remainder of this patent application.

FIG. 1 also includes a sense-level voltage circuit 2, shown within a dotted outline. Sense-level circuit 2 serves to adapt the voltage generated by voltage-reference circuit 1 to a particular application involved in sensing the logic levels in a memory cell, as will become clearer in the discussion of FIG. 2 below.

A current source $I_1$ is connected between a source of positive supply voltage $V_{cc}$, which might be 5 volts DC for example, and the base of an NPN transistor Q1. The emitter of Q1 is connected to the emitter of a PNP transistor Q2, while the base of Q1 is connected to the base of an NPN transistor Q5.

The collector of Q2 is connected to the base of an NPN transistor Q3, while the base of Q2 is connected to the collector of transistor Q3. Transistors Q2 and Q3 are actually realized in the form of a single silicon-controlled rectifier (SCR) 3, symbolized by the dotted line in FIG. 1. As is well known, the SCR is a four-layer device having layers of alternating conductivity type, as PNPN. Consequently, such an SCR may be conceived of as a PNP transistor and an NPN transistor interconnected as Q2 and Q3 are interconnected in FIG. 1.

The emitter of Q3 connects to the base of Q4 and to a current source $I_2$, the other end of which connects to ground. Current source $I_2$ serves to maintain a constant, preselected current in SCR 3, while current source $I_1$ establishes the current in Q4.

The collector of Q3 and the base of Q2 connect to the base of an NPN transistor Q6. The emitter of Q6 is coupled to ground through a resistor R2, and the collector of Q6 is coupled to the emitter of Q5 by means of a resistor R1.

The collector of Q6 is connected to the base of an NPN transistor Q7 in sense-level circuit 2 by means of a voltage-reference output line 5, shown broken in FIG. 1. The collector of Q7 is coupled to $V_{cc}$ by means of a resistor R3, while the emitter of the same transistor is coupled to ground through a resistor R4.

The collector of Q7 is coupled to the base of a transistor Q8, while the collector of Q8 is coupled to $V_{cc}$. A current source 19 is connected between ground and the emitter of Q8. In the embodiment disclosed, the output of FIG. 1 is a voltage $V_{sl}$ derived from the emitter of Q8.

The operation of the circuits of FIG. 1 can best be understood by considering what voltages will be present on the various nodes of the circuit in view of the voltage drops between the terminals of the transistors. In the following discussion of this topic, $V_{ben}$ is the base-emitter voltage drop of an NPN transistor, $V_{bep}$ is the same quantity for a PNP transistor, and $V_{cen}$ is the collector-emitter drop of an NPN transistor.

As shown in FIG. 1, node 9 includes the collector of Q3. Its voltage referenced to ground can be simply derived by considering the voltage drops along a path from the collector to emitter of Q3 and through the base-emitter junction of Q4:

$$V_9 = V_{cen} + V_{ben}$$

Similarly, the voltage on node 11, the emitter of transistor Q6, can be found by considering that it differs from the voltage on node 9 by one base-emitter drop:

$$V_{11} = V_{cen} + V_{ben} = V_{cen}$$

The voltage on node 13 is greater than the voltage on node 9 by one PNP base-emitter drop plus one NPN base-emitter drop:

$$V_{13} = V_9 + V_{bep} + V_{ben} = V_{cen} + 2V_{ben} + V_{bep}$$

The voltage on node 15 is lower than the voltage on 13 by one base-emitter drop:

$$V_{15} = V_{13} - V_{ben} = V_{cen} V_{ben} + V_{bep}$$

The voltage on line 5 is lower than the voltage on node 15 by the $I_{r1}R1$ drop through resistor R1, and $I_{r1}$ is established by $V_{11}$ and R2:

$$I_{r1} = V_{11}/R2 = V_{cen}/R2$$
$$V_5 = V_{15} - I_{r1}R1 = V_{cen} + V_{ben} + V_{bep} - (R1/R2)(V_{cen})$$

By making the values of R1 and R2 identical, the $V_{cen}$ terms cancel, and:

$$V_5 = V_{ben} + V_{bep}$$

The voltage on node 17 is lower by one base-emitter drop:

$$V_{17} = V_5 - V_{ben} = V_{bep}$$

The voltage on sense level output line 7 is referenced to $V_{cc}$, and is lower than $V_{cc}$ by the drop through resistor R3:

$$V_7 = V_{cc} - I_{r3}R3 = V_{cc} - (V_{17}/R4) = V_{cc} - (V_{bep})(R3/R4)$$

As in the above, if R3 and R4 are made equal, then $V_7$ differs from the $V_{cc}$ level by the base-emitter drop of a PNP transistor.

$$V_7 = V_{cc} - V_{bep}$$

Figure 2:
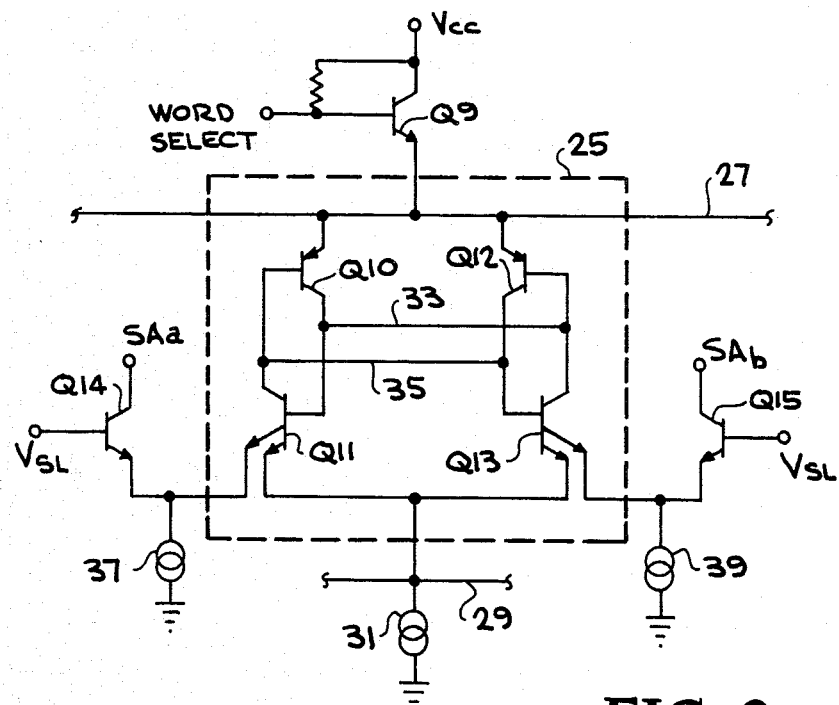
FIG. 2 in an illustration in schematic form of a portion of a memory circuit with which the invention may be used.

However, for reasons which will become obvious from the discussion of the application of the circuit of FIG. 1 to the circuit of FIG. 2, R3 and R4 will be selected to have values that are in the radio of 1:2, such that:

$$V_7 = V_{cc} - \tfrac{1}{2} V_{bep}$$

Also for reasons relating to the application illustrated by FIG. 2, the additional stage consisting of transistor Q8 and current source 19 were added, resulting in an additional drop of $V_{ben}$ and producing a sense-level voltage $V_{sl}$ at the emitter of Q8:

$$V_{sl} = V_{cc} - V_{ben} - \tfrac{1}{2} V_{bep}$$

The reasons for adding this additional stage and for deriving this particular output voltage will become apparent in the discussion of FIG. 2 which follows.

In the foregoing analysis the output voltage of the voltage reference circuit of FIG. 1 was derived principally from the individual base-emitter and collector-emitter voltage drops of the circuit. Such an analysis overlooks minor variations in these voltage drops which can be caused by variations in bias conditions. In particular, it is especially important to control the current through SCR 3 by selecting the parameters of current source $I_2$ such that it exactly duplicates the current through the SCR elements of the memory cells which are to be sensed.

Turning now to FIG. 2, a portion of the circuit of a static RAM (randomly accessible read-write memory) is illustrated as an application of the circuit of FIG. 1. The circuit of FIG. 2 shows a core cell 25 indicated by the dotted line. A single bit of data (a binary 1 or 0) is stored within core cell 25 and may be read or rewritten by accessing the cell for these purposes.

A positive word line 27 and a negative word line 29 extend to all of the similar core cells in the row on which cell 25 is located. The row on which cell 25 is located is accessed by activating a word-select transistor Q9 which is in turn driven by a signal from a row-select decoder circuit (not shown) connected to its base terminal, labeled "Word Select" in FIG. 2. Current to all of the cells on the same row as cell 25 is controlled by a single current source 31 connected to the negative word line 29.

Within cell 25, a pair of PNP transistors Q10 and Q12 are connected to a pair of dual-emitter NPN transistors Q11 and Q13 to form a bistable multivibrator circuit or flip-flop in a well-known manner. As discussed earlier in this application, the elements of this flip-flop circuit are actually realized as four-layer (PNPN) SCR devices, such that transistors Q10 and Q11 form one SCR and transistors Q12 and Q13 form another in the same manner that transistors Q2 and Q3 of FIG. 1 do.

A pair of cross-coupling lines 33 and 35 couple the two branches of the cell 25 such that when Q10 and Q11 are conducting, Q12 and Q13 are cut off, and vice versa, in a manner that is well known. These two stable states of conduction are arbitrarily assigned the values of 0 and 1, such that the binary data in cell 25 is actually relected by the conductive state of the two branches of the cell.

For purposes of understanding the application of the present invention, it is assumed that cell 25 in FIG. 2 has been selected in order to read its data content. Accordingly, a pair of bit-line current sources 37 and 39 have been shown directly coupled to transistors Q11 and Q13, even though in practice these current sources are separated from Q11 and Q13 by gate transistors (not shown) driven by the column-address decoder (not shown). A pair of sense-coupling transistors Q14 and Q15 couple the inputs $SA_a$ and $SA_b$ of the sense amplifier (not shown) to the emitters of Q11 and Q13 whenever current sources 37 and 39 are turned on by the column-address decoder circuit (not shown).

The common connection of the emitters of Q11 and Q14 to current source 37 forms a differential amplifier such that the current controlled by source 37 flows from the transistors in accordance with the relative potential on their base electrodes. The same is true of transistors Q13 and Q15 and current source 39.

In order that the sense amplifier perform its function most reliably despite slight variations in device parameters, it is essential that $V_{sl}$ be established at a level which is very nearly mid-way between the voltages on the bases of Q11 and Q13. In order to determine this level, the same sort of node-by-node analysis applied to the circuit of FIG. 1 is useful.

The collector of Q9 is at the $V_{cc}$ level, while its base is also at nearly this same level when the row on which cell 25 is located is selected by a high input on the base of Q9. Under these conditions, positive row line 27 is held at a potential of:

$$V_{27} = V_{bq9} - V_{ben}$$

and $$V_{bq9} \doteq V_{cc}$$

such that $$V_{27} = V_{cc} - V_{ben}$$

Let us assume that the left side of cell 25 in ON (conducting) while the right side is cut off. Then the voltage on the base transistor Q11 is the same as the voltage on line 27 minus the collector-emitter drop of a PNP transistor (Q10):

$$V_{bq11} = V_{27} - V_{cep}$$

However, this drop is negligible due to the symmetrical structure of the PNP transistor, and:

$$V_{bq11} = V_{27} = V_{cc} - V_{ben}$$

Because of line 35, the voltage on the base of Q13 will be lower than the $V_{27}$ voltage by the base-emitter drop of a PNP transistor (Q10):

$$V_{bq13} = V_{27} - V_{bep} = V_{cc} - V_{ben} - V_{bep}$$

As noted above, $V_{sl}$ should be set to approximately the mid-point between these two voltages, which is:

$$V_{sl} = V_{cc} - V_{ben} - \tfrac{1}{2} V_{bep}$$

Accordingly, we have shown that the circuit of FIG. 1 will produce the correct voltage $V_{sl}$ for the sense-level application of FIG. 2. This is only one of a number of similar applications for the circuit of FIG. 1. In general, any application involving a need to produce a voltage reference level which depends in part upon $V_{bep}$, the base-emitter voltage of a saturated PNP transistor, can be solved by the use of the circuit of FIG. 1, together with more or less additional stages to shift or otherwise alter the voltage output by selected amounts.

The circuit of FIG. 1 was developed in order to meet a need to generate a reference voltage which replicates the base-emitter voltage of a saturated PNP transistor. However, the teachings of this invention, and even the particular circuit arrangements of FIG. 1 are not limited to use in generation of the base-emitter voltage of a PNP transistor.

The concepts embodied in this invention were developed while working in the normal bipolar process technology, which is an NPN process. In this environment, the replication of NPN terminal voltages for use in a reference-voltage source is relatively easy, while replication of corresponding PNP terminal voltages is more difficult.

However, workers in a PNP-process technology will encounter similar difficulties in replicating the voltages associated with an NPN transistor. For them, the circuit arrangements and concepts of this invention can equally well be applied to the problem of replicating NPN terminal voltages in a PNP-process technology. Other applications will also be obvious to those skilled in the arts to which this invention relates.

Although this invention has been described with some particularity in reference to specific embodiments thereof which, taken together, comprise the best mode known to the inventor for carrying out his invention, many modifications could be made and many alternative embodiments could thus be derived without exceeding the scope of the invention. Consequently, the scope of the invention is to be determined only from the following claims.

I claim:

1. A voltage-reference circuit for producing a reference-voltage output which is a function of $V_{be}$, the base-emitter drop of a transistor, comprising:
   a multi-layer semiconductor device including at least a region thereof having four adjacent layers of alternating conductivity type (PNPN) and having a first terminal coupled to the end P-layer of said four layers, and a second terminal coupled to the end N-layer of said four layers;
   means to produce a current in said device between said terminals, to thereby produce a voltage between said terminals which is the sum of $V_{be}$ and an intrinsic transistor terminal drop;
   means coupled to said terminals to subtract from said voltage said intrinsic transistor terminal drop.

2. The voltage-reference circuit of claim 1 wherein said multi-layer semiconductor device comprises a four-layer silicon-controlled rectifier device.

3. The voltage-reference circuit of claim 1 wherein said $V_{be}$ is $V_{bep}$, the base-emitter drop of a PNP transistor, and wherein said intrinsic transistor terminal drop is $V_{cen}$, the collector-emitter terminal drop of an NPN transistor.

4. The voltage-reference circuit of claim 1 further comprising a third terminal coupled to one of said layers intermediate said end layers, and wherein said means to subtract is coupled to said third terminal to extract therefrom a voltage which is a function of said intrinsic transistor terminal drop.

5. The voltage-reference circuit of claim 1 wherein said means to subtract comprises:
   an NPN transistor having base, emitter and collector terminals, said collector terminal being coupled to a supply voltage, said base terminal being adapted for connection to said first terminal;
   a resistor having one end thereof coupled to said emitter terminal of the NPN transistor; and
   means, coupled to the other end of said resistor, to induce in said resistor a current proportional to said intrinsic transistor terminal drop.

6. The voltage-reference circuit of claim 5 wherein said means to induce a current comprises:
   current source means having an input terminal for coupling to a source of input voltage and an output terminal coupled to said other end of said resistor, for producing in said resistor a current which is proportional to said input voltage.

7. The voltage-reference circuit of claim 6 wherein said current source comprises:
   a second NPN transistor having base, emitter and collector terminals, said base terminal being connected to a source of said intrinsic transistor terminal drop voltage, said collector terminal being coupled to said other end of said first resistor; and
   a second resistor coupled to said emitter terminal.

8. The voltage-reference circuit of claim 7 wherein said base terminal is coupled to one of the layers of said semiconductor device intermediate said end layers to extract therefrom a voltage which is a function of an intrinsic transistor terminal drop.

9. The voltage-reference circuit of claim 8 wherein said base terminal is coupled to the N-layer adjacent the end P-layer of said PNPN device.

10. The voltage-reference circuit of claim 8 wherein said intrinsic transistor terminal drop is $V_{cen}$, the collector-emitter voltage drop of an NPN transistor.

11. The voltage-reference circuit of claim 1 wherein said means to produce a current in said semiconductor device further comprises means to regulate said current to a predetermined magnitude.

12. The voltage-reference circuit of claim 1 further including feedback-circuit means coupled between said first and second terminals of said semiconductor device to reduce the temperature-dependency of said voltage produced between said first and second terminals.

13. The voltage-reference circuit of claim 12 wherein said feedback-circuit means comprises:
   a first transistor having its base terminal coupled to said second terminal of said semiconductor device;
   a current source coupled to the collector of said first transistor to supply a constant current thereto; and
   a second transistor having its base terminal coupled to said first transistor collector terminal, said second transistor emitter terminal being coupled to said first terminal of said semiconductor device.

14. A voltage-reference circuit for producing a reference-voltage output which is a function of $V_{bep}$, the base-emitter drop of a PNP transistor, comprising:
   a silicon-controlled rectifier device having four adjacent layers of alternating conductivity type (PNPN) and having a first terminal coupled to the end P-layer of said four layers, and a second terminal coupled to the end N-layer of said four layers;
   current-source means to produce a substantially constant current in said device from said first terminal to said second terminal to thereby produce a voltage between said terminals which is the sum of $V_{bep}$ and $V_{cen}$, the collector-emitter terminal drop of an NPN transistor;
   means coupled to said terminals to subtract $V_{cen}$ from said voltage;
   said means to subtract including:
      an NPN transistor having base, emitter and collector terminals, said collector terminal being coupled to a supply voltage, said base terminal being adapted for connection to said first terminal;
      a resistor having one end thereof coupled to said emitter terminal of the NPN transistor; and
      means, coupled to the other end of said resistor, to induce in said resistor a current proportional to said $V_{cen}$ terminal drop.

15. The voltage-reference circuit of claim 14 further including feedback-circuit means coupled between said first and second terminals of said silicon-controlled rectifier device to reduce the temperature-dependency of said voltage produced between said first and second terminals.

16. The voltage-reference circuit of claim 15 wherein said feedback-circuit means comprises:
   a first transistor having its base terminal coupled to said second terminal of said semiconductor device;
   a current source coupled to the collector of said first transistor to supply a constant current thereto; and
   a second transistor having its base terminal coupled to said first transistor collector terminal, said second transistor emitter terminal being coupled to said first terminal of said semiconductor device.

17. A voltage-reference circuit for producing a reference-voltage output which is a function of $V_{bep}$, the base-emitter drop of a PNP transistor, comprising:
- a silicon-controlled rectifier device having four adjacent layers of alternating conductivity type (PNPN) and having a first terminal coupled to the end P-layer of said four layers, and a second terminal coupled to the end N-layer of said four layers;
- current-source means to produce a substantially constant current in said device from said first terminal to said second terminal to thereby produce a voltage between said terminals which is the sum of $V_{bep}$ and $V_{cen}$, the collector-emitter terminal drop of an NPN transistor;
- feedback-circuit means coupled between said first and second terminals of said semiconductor device to reduce the temperature-dependency of said voltage produced between said first and second terminals;
- a third terminal coupled to the N-layer of said device adjacent said end P-layer to derive at said third terminal a voltage of $V_{cen}$ with respect to the potential of said end N-layer;
- a first NPN transistor having base, emitter and collector terminals, said collector terminal being coupled to a supply voltage, said base terminal being adapted for connection to said first terminal;
- a first resistor R1 having one end thereof coupled to said emitter terminal of the first NPN transistor;
- a second NPN transistor having its base electrode coupled to said third terminal, having its collector coupled to the other end of said first resistor R1, and having its emitter coupled by a second resistor R2 to ground, said resistors R1 and R2 having substantially equal resistance R, whereby a current of substantially $V_{cen}/R$ flows in each resistor, and whereby said second NPN transistor has a voltage on its collector of substantially $V_{bep}$.

18. The voltage-reference circuit of claim 17 wherein said feedback-circuit means comprises:
- a first transistor having its base terminal coupled to said second terminal of said semiconductor device;
- a current source coupled to the collector of said first transistor to supply a constant current thereto; and
- a second transistor having its base terminal coupled to said first transistor collector terminal, said second transistor emitter terminal being coupled to said first terminal of said semiconductor device.

* * * * *